United States Patent
Yamashita (10) Patent No.: US 10,651,228 B2
(45) Date of Patent: May 12, 2020

(54) PHOTODETECTOR, METHOD FOR MANUFACTURING THE SAME, AND IMAGING APPARATUS

(71) Applicant: FUJITSU LIMITED, Kawasaki-shi, Kanagawa (JP)

(72) Inventor: Hiroyasu Yamashita, Isehara (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 16/242,132

(22) Filed: Jan. 8, 2019

(65) Prior Publication Data

US 2019/0221603 A1 Jul. 18, 2019

(30) Foreign Application Priority Data

Jan. 18, 2018 (JP) .................. 2018-006350

(51) Int. Cl.
*G01J 5/00* (2006.01)
*H01L 27/146* (2006.01)
(Continued)

(52) U.S. Cl.
CPC .... *H01L 27/14669* (2013.01); *H01L 27/1446* (2013.01); *H01L 27/14601* (2013.01);
(Continued)

(58) Field of Classification Search
CPC ......... H01L 27/14669; H01L 27/14694; H01L 27/14653; H01L 31/111; H01L 31/035236;
(Continued)

(56) References Cited

U.S. PATENT DOCUMENTS

2003/0059998 A1* 3/2003 Holonyak, Jr. ........ B82Y 10/00
438/200
2003/0170927 A1* 9/2003 Holonyak, Jr. ........ B82Y 10/00
438/47

(Continued)

FOREIGN PATENT DOCUMENTS

JP 2001-44486 2/2001
JP 2015-88688 5/2015

OTHER PUBLICATIONS

Ariyawansa et al., "Multi-color tunneling quantum dot infrared photodetectors operating at room temperature," 2007, Infrared Physics &Technology, vol. 50, pp. 156-161. (Year: 2007).*

(Continued)

*Primary Examiner* — Kiho Kim
(74) *Attorney, Agent, or Firm* — Fujitsu Patent Center (57) ABSTRACT

A photodetector includes a quantum dot group including a first quantum dot of a reference size and a second quantum dot of a size other than the reference size, a first resonant tunneling structure disposed on a first side of the quantum dot group and including a barrier layer, a well layer, and a barrier layer, and a second resonant tunneling structure disposed on a second side of the quantum dot group and including a barrier layer, a well layer, and a barrier layer, wherein a first resonance level of the first resonant tunneling structure and a ground level of the first quantum dot have a relationship that causes tunneling, and a second resonance level of the second resonant tunneling structure and an excited level of the first quantum dot have a relationship that causes tunneling.

8 Claims, 10 Drawing Sheets

(51) Int. Cl.
   *H01L 31/111*   (2006.01)
   *H01L 31/0352*  (2006.01)
   *H01L 27/144*   (2006.01)
   *H01L 29/12*    (2006.01)
   *H01L 31/0304*  (2006.01)

(52) U.S. Cl.
   CPC .. *H01L 27/14634* (2013.01); *H01L 27/14652* (2013.01); *H01L 27/14694* (2013.01); *H01L 29/127* (2013.01); *H01L 31/03046* (2013.01); *H01L 31/035236* (2013.01); *H01L 31/111* (2013.01)

(58) Field of Classification Search
   CPC ........... H01L 27/14634; H01L 27/1446; H01L 27/14601; H01L 29/127; H01L 31/03046
   See application file for complete search history.

(56) References Cited

U.S. PATENT DOCUMENTS

| | | | | |
|---|---|---|---|---|
| 2005/0017176 | A1* | 1/2005 | Koch | B82Y 10/00 250/338.4 |
| 2006/0231862 | A1* | 10/2006 | Otsuka | H01L 29/7371 257/197 |
| 2007/0137693 | A1* | 6/2007 | Forrest | B82Y 15/00 136/255 |
| 2008/0078989 | A1* | 4/2008 | Croke | B82Y 20/00 257/21 |
| 2012/0175593 | A1* | 7/2012 | Murayama | H01L 31/035218 257/13 |
| 2015/0010031 | A1* | 1/2015 | Makino | H01S 5/18311 372/45.01 |
| 2015/0123076 | A1 | 5/2015 | Fujita et al. | |
| 2015/0123701 | A1* | 5/2015 | Obradovic | H01L 29/0669 326/5 |
| 2016/0197213 | A1* | 7/2016 | Lewis | H01L 31/035218 438/95 |
| 2016/0233449 | A1* | 8/2016 | Murayama | C09K 11/565 |
| 2017/0012076 | A1* | 1/2017 | Chen | H01L 27/14652 |

OTHER PUBLICATIONS

Ting et al., "Complementary barrier infrared detector (CBIRD) with double tunnel junction contact and quantum dot barrier infrared detector (QD-BIRD)", 2013, Infrared Physics & Technology, vol. 59, pp. 146-151. (Year: 2013).*

Chu et al., "Modulation characterisistics of AlAs/GaAs double barrier quantum well resonant tunneling structure at microwave frequencies," 1995, Material Science and Engineering, vol. B35, pp. 446-448. (Year: 1995).*

* cited by examiner

PHOTODETECTOR, METHOD FOR MANUFACTURING THE SAME, AND IMAGING APPARATUS

CROSS-REFERENCE TO RELATED APPLICATION

This application is based upon and claims the benefit of priority of the prior Japanese Patent Application No. 2018-6350, filed on Jan. 18, 2018, the entire contents of which are incorporated herein by reference.

FIELD

The embodiment discussed herein is related to a photodetector, a method for manufacturing the same, and an imaging apparatus.

BACKGROUND

Photodetectors include, for example, a photodetector using quantum wells or quantum dots, that is, a quantum photodetector. Such a quantum photodetector includes, for example, a quantum infrared detector.

A photodetector using quantum dots among these photodetectors is configured such that electrons bound to quantum dots absorb light, are excited, escape from the bound state, and generate optical current. For example, Japanese Laid-open Patent Publication No. 2015-88688, Japanese Laid-open Patent Publication No. 2001-44486, and the like are disclosed as related arts.

For the photodetector using quantum dots, quantum dots having a desired size and quantum levels leading to a desired detection wavelength are desirably formed.

However, despite the intention to form the quantum dots having the desired size and the quantum levels leading to the desired detection wavelength, the size variation in the quantum dots causes formation of quantum dots of sizes other than the desired size.

The quantum dots of the sizes other than the desired size have different quantum levels. Accordingly, the quantum dots do not contribute to optical current but contribute to dark current (noise current).

For example, quantum dots of a size larger than the desired size do not contribute to optical current due to an absorption probability decrease, a decrease in excited level escape probability, or the like but contribute to dark current due to trapping of electrons flowing as the optical current, electron escape caused by thermal excitation, or the like.

For example, quantum dots of a size smaller than the desired size do not contribute to optical current due to an absorption probability decrease, a transition probability decrease, or the like but contribute to dark current due to trapping of electrons flowing as the optical current, electron escape caused by thermal excitation, or the like.

As a result, a signal-to-noise ratio (S/N) of the photodetector is deteriorated.

Under these circumstances, an S/N is desirably improved in a photodetector using quantum dots.

SUMMARY

According to an aspect of the embodiments, a photodetector includes a quantum dot group including a first quantum dot of a reference size and a second quantum dot of a size other than the reference size, a first resonant tunneling structure disposed on a first side of the quantum dot group and including a barrier layer, a well layer, and a barrier layer, and a second resonant tunneling structure disposed on a second side of the quantum dot group and including a barrier layer, a well layer, and a barrier layer, wherein a first resonance level of the first resonant tunneling structure and a ground level of the first quantum dot have a relationship that causes tunneling, and a second resonance level of the second resonant tunneling structure and an excited level of the first quantum dot have a relationship that causes tunneling.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, a photodetector, a method for manufacturing the same, and an imaging apparatus according to an embodiment will be described by using drawings with reference to FIGS. 1 to 10.

The photodetector according to this embodiment is a quantum photodetector and also is a photodetector using quantum dots (quantum dot photodetector).

Hereinafter, a quantum dot infrared detector (quantum infrared detector) that is a type of a quantum dot photodetector will be described taken as an example. An infrared detector is also referred to as an infrared sensor.

Figure 1:
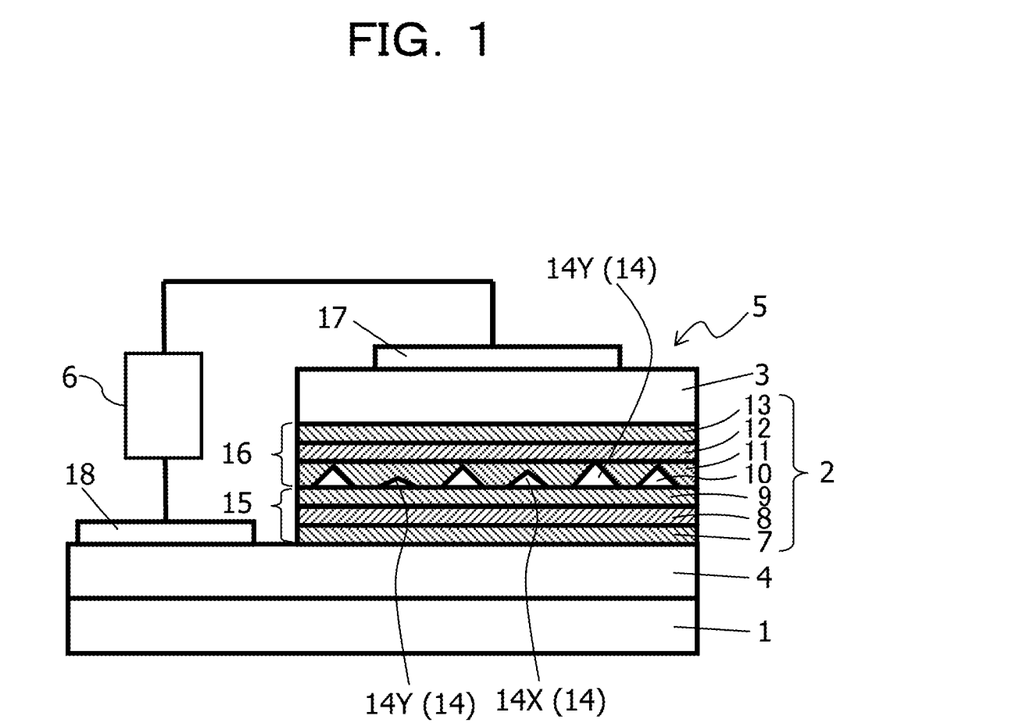
FIG. 1 is a schematic cross-sectional view illustrating the configuration of a photodetector according to an embodiment.

A quantum dot infrared detector of this embodiment that generates optical current in accordance with an amount of incident infrared rays includes, as illustrated in FIG. 1, an infrared detecting element 5 on a substrate 1 and an external circuit 6 connected to the infrared detecting element 5. The infrared detecting element 5 includes an active layer 2 formed from a semiconductor material made active in response to an infrared ray, an upper-electrode layer 3, and a lower-electrode layer 4. The upper-electrode layer 3 and the lower-electrode layer 4 are respectively disposed on upper and lower sides of the active layer 2.

The substrate 1 is a semi-insulating semiconductor substrate. The upper-electrode layer 3 and the lower-electrode layer 4 are each a conductive semiconductor layer. An upper electrode 17 is disposed on the upper-electrode layer 3, a lower electrode 18 is disposed on the lower-electrode layer 4, and the external circuit 6 is connected to the upper electrode 17 and the lower electrode 18.

The active layer 2 is also referred to as an active region. The active layer 2 is a layer that absorbs light and thus is also referred to as a light absorbing layer. The active layer 2 is a layer in which photoelectric conversion is performed and thus is also referred to as a photoelectric conversion layer. The upper-electrode layer 3 and the lower-electrode layer 4 are each also referred to as an electrode forming layer, a contact layer, or a contact region. The infrared detecting element 5 is also referred to as an infrared detecting element, a detector element, a sensor element, a light receiving element, an optical semiconductor element, or a sensing unit. The infrared detecting element 5 may be regarded as a resistor having a resistance value varying in accordance with incident light (infrared rays herein) and thus is also referred to as a photoconductor element.

In this embodiment, the infrared detecting element 5 includes, as the active layer 2, a quantum-dot active layer including a structure in which a barrier layer 7, a well layer 8, a barrier layer 9, a quantum dot group 10, a barrier layer 11, a well layer 12, and a barrier layer 13 are stacked in order (a structure having these layers adjacent to each other).

The quantum dot group 10 includes a plurality of quantum dots 14. The quantum dot group 10 includes first quantum dots 14X having a desired size and quantum levels leading to a desired detection wavelength and second quantum dots 14Y of sizes other than the desired size. The plurality of quantum dots 14 are formed in a layer and thus are also referred to as a quantum dot layer. The desired size is also referred to as a reference size.

Energy at the conduction band bottom of each of the barrier layers 7, 9, 11, and 13 is higher than energy at the conduction band bottom of each of the well layers 8 and 12 and the quantum dots 14 included in the quantum dot group 10. The quantum dots 14 included in the quantum dot group 10 are buried in the barrier layers 9 and 11 formed from a semiconductor material having a larger band gap.

A first resonant tunneling structure 15 includes the barrier layer 7, the well layer 8, and the barrier layer 9 that are disposed on a first side (a lower side herein) of the quantum dot group 10, and a second resonant tunneling structure 16 includes the barrier layer 11, the well layer 12, and the barrier layer 13 that are disposed on a second side (an upper side herein) of the quantum dot group 10. For example, the first resonant tunneling structure 15 and the second resonant tunneling structure 16 are disposed on the respective sides of the quantum dot group 10.

As described above, the infrared detecting element 5 includes the quantum dot group 10, the first resonant tunneling structure 15, and the second resonant tunneling structure 16. The quantum dot group 10 includes the first quantum dots 14X of the desired size and the second quantum dots 14Y of sizes other than the desired size. The first resonant tunneling structure 15 is disposed on the first side of the quantum dot group 10 and includes the barrier layer 7, the well layer 8, and the barrier layer 9. The second resonant tunneling structure 16 is disposed on the second side of the quantum dot group 10 and includes the barrier layer 11, the well layer 12, and the barrier layer 13.

Figure 2:
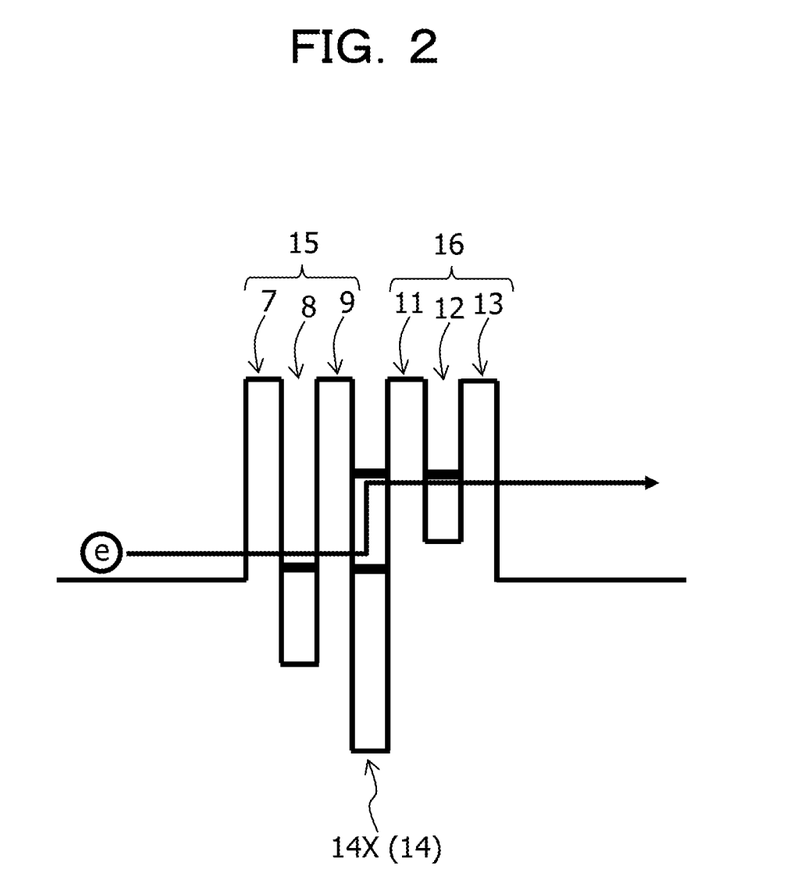
FIG. 2 is an energy band diagram including a first quantum dot of a desired size in the photodetector according to this embodiment.

As illustrated in FIG. 2, the first resonance level of the first resonant tunneling structure 15 and the ground level of each first quantum dot 14X have a relationship that causes tunneling, and the second resonance level of the second resonant tunneling structure 16 and the excited level of the first quantum dot 14X have a relationship that causes tunneling.

Figure 3:
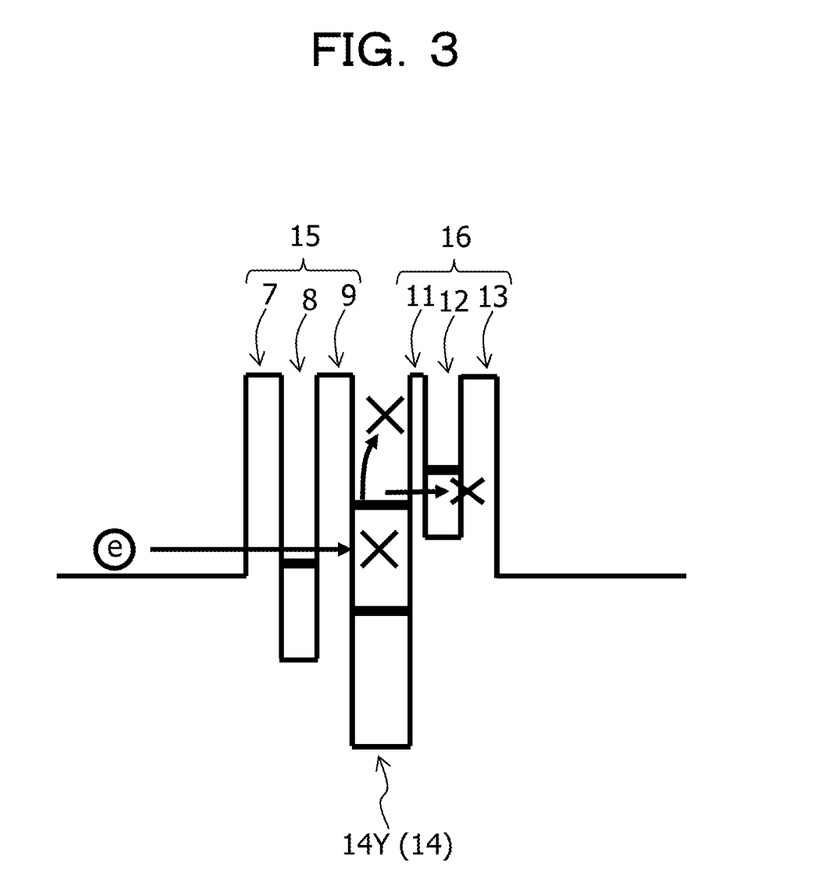
FIG. 3 is an energy band diagram including a second quantum dot of a size larger than the desired size in the photodetector according to this embodiment.

If the size of a second quantum dot 14Y is larger than the desired size, the first resonance level of the first resonant tunneling structure 15 and the ground level of the second quantum dot 14Y have a relationship that does not cause tunneling, and the second resonance level of the second resonant tunneling structure 16 and the excited level of the second quantum dot 14Y have a relationship that does not cause tunneling, as illustrated in FIG. 3.

Figure 4:
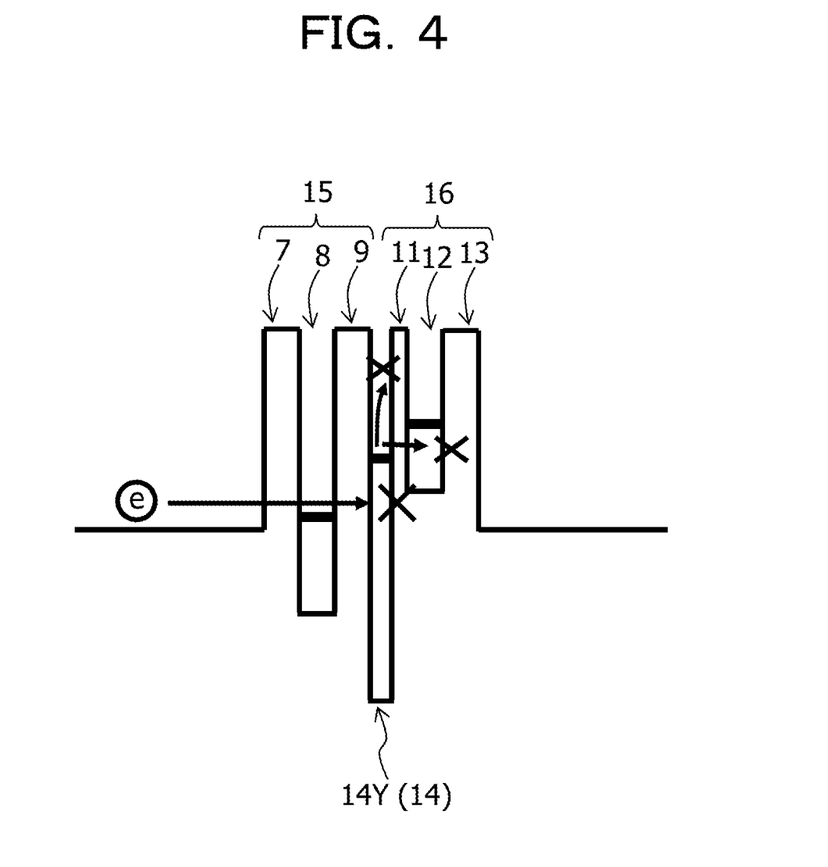
FIG. 4 is an energy band diagram including a second quantum dot of a size smaller than the desired size in the photodetector according to this embodiment.

If the size of a second quantum dot 14Y is smaller than the desired size, the first resonance level of the first resonant tunneling structure 15 and the ground level of the second quantum dot 14Y have a relationship that does not cause tunneling, and the second resonance level of the second resonant tunneling structure 16 and the ground level of the second quantum dot 14Y have a relationship that does not cause tunneling, as illustrated in FIG. 4.

As described above, each quantum level of the second quantum dot 14Y of a size other than the desired size and a corresponding one of the first resonance level of the first resonant tunneling structure 15 and the second resonance level of the second resonant tunneling structure 16 have a corresponding one of the relationships that do not cause tunneling.

In this embodiment, as illustrated in FIGS. 2 to 4, the first resonance level of the first resonant tunneling structure 15 and the second resonance level of the second resonant tunneling structure 16 are different from each other.

It is desirable that the first resonance level of the first resonant tunneling structure 15 and the ground level of the first quantum dot 14X match and the second resonance level of the second resonant tunneling structure 16 and the excited level of the first quantum dot 14X match.

For example, it is desirable to have the materials and the thicknesses of the barrier layer 7, the well layer 8, and the barrier layer 9 included in the first resonant tunneling structure 15 and the barrier layer 11, the well layer 12, and the barrier layer 13 included in the second resonant tunneling structure 16 such that the first resonance level of the first resonant tunneling structure 15 and the ground level of the first quantum dot 14X match and such that the second resonance level of the second resonant tunneling structure 16 and the excited level of the first quantum dot 14X match.

In each of the barrier layer 9 that is included in the first resonant tunneling structure 15 and that is in contact with the quantum dot group 10 and the barrier layer 11 that is included in the second resonant tunneling structure 16 and that is in contact with the quantum dot group 10 (see FIG. 1), energy at the conduction band bottom desirably has a level enabling electron escape caused by thermal excitation to be restrained, the electron escape being from the bound level of each of the first quantum dot 14X and the second quantum dot 14Y to the continuum, as illustrated in FIGS. 2 to 4.

As described above, the barrier layers 9 and 11 near the quantum dots 14 are desirably formed from a material having sufficiently high energy at the conduction band bottom.

This enables thermal excitation from the bound level of each quantum dot 14 to the continuum to be sufficiently restrained.

Figures 5A, 5B:
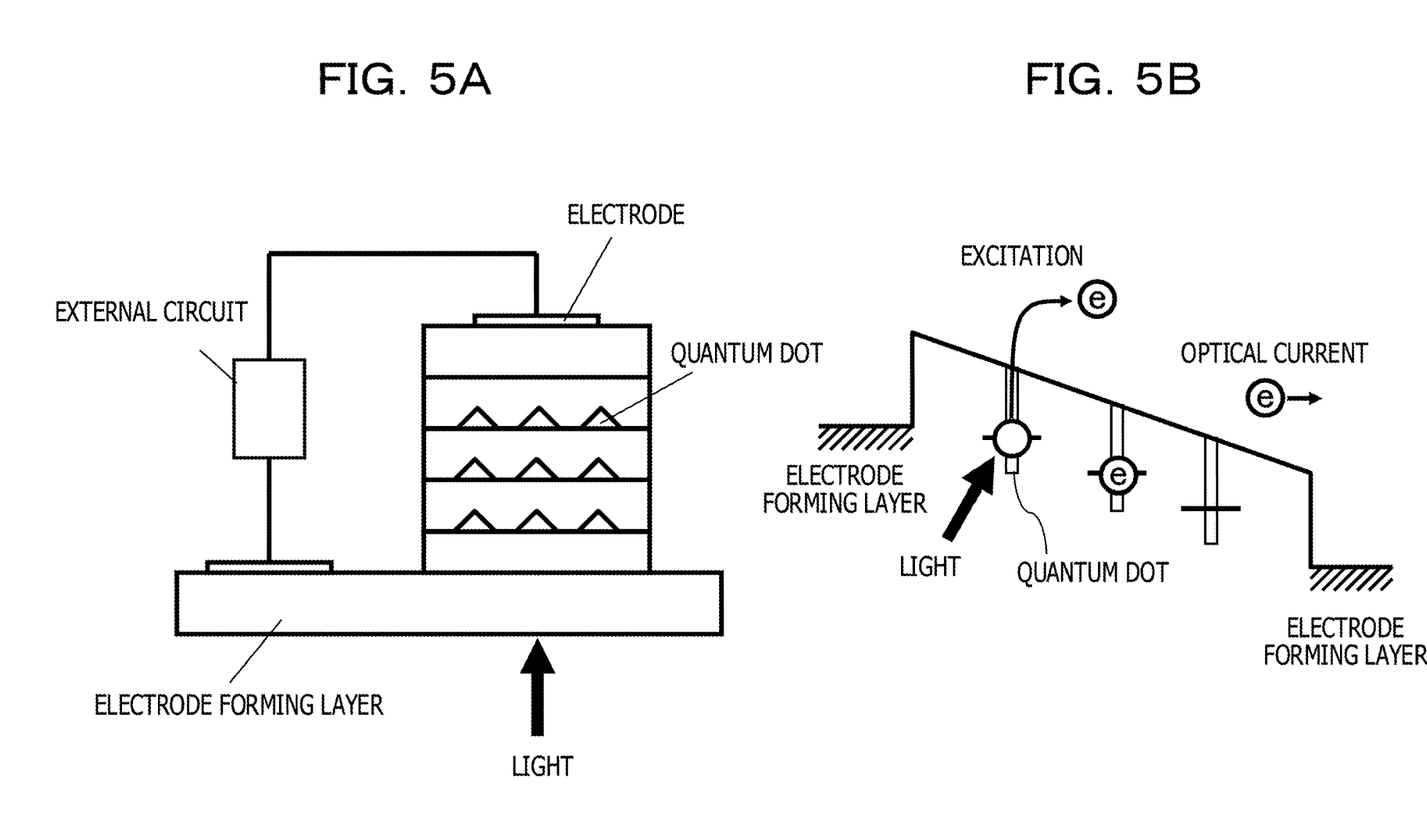
FIG. 5A is a schematic cross-sectional view illustrating the configuration of a general quantum dot infrared detector.
FIG. 5B is an energy band diagram for explaining the operation of the general quantum dot infrared detector.

As illustrated in FIGS. 5A and 5B, a general quantum dot infrared detector is configured such that electrons bound to quantum dots absorb light, are excited, escape from the bound state, and generate optical current.

Figure 6:
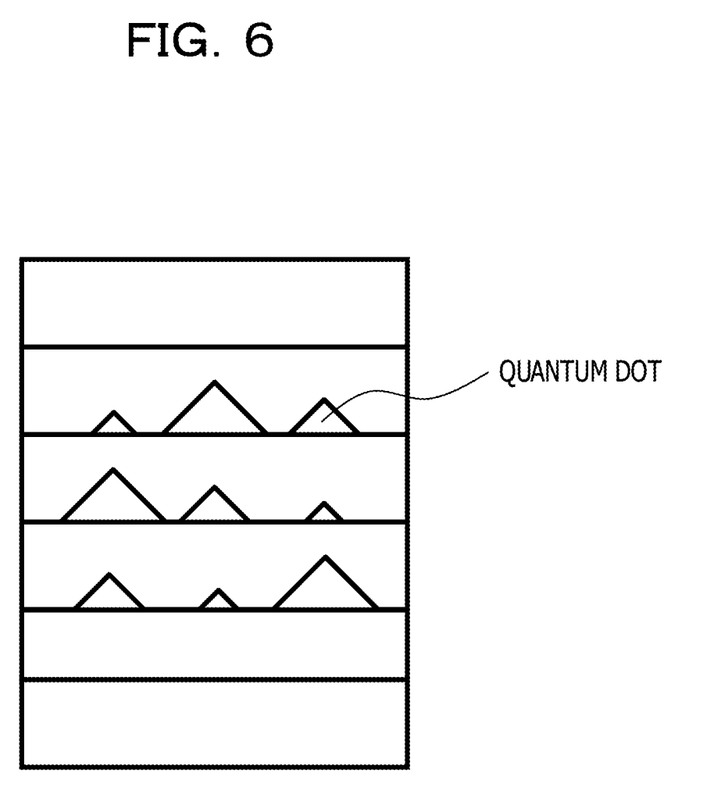
FIG. 6 is a schematic cross-sectional view for explaining an issue to be addressed by the embodiment.

FIG. 5A illustrates all of the quantum dots of the same size; however, actually, the sizes of the quantum dots vary, as illustrated in FIG. 6.

The photon energy of infrared rays absorbed and detected by the quantum dot infrared detector corresponds to an energy difference between quantum levels for electron transition caused by the absorption.

Accordingly, it is desirable to provide quantum levels appropriate for a desired detection wavelength.

Generally, to form quantum dots, self-organization caused by distortion due to a crystal lattice constant difference is used (Stranski-Krastanov growth mode). The quantum dots as described above are referred to as self-organization quantum dots.

The sizes of the quantum dots formed in this manner have variations (see FIG. 6). Since the degrees of quantum confinement vary with the sizes of quantum dots, for example, as illustrated in FIGS. 7A to 7C, the quantum levels caused by the quantum dots of different sizes have different levels of energy (quantum level positions).

Figure 7A:
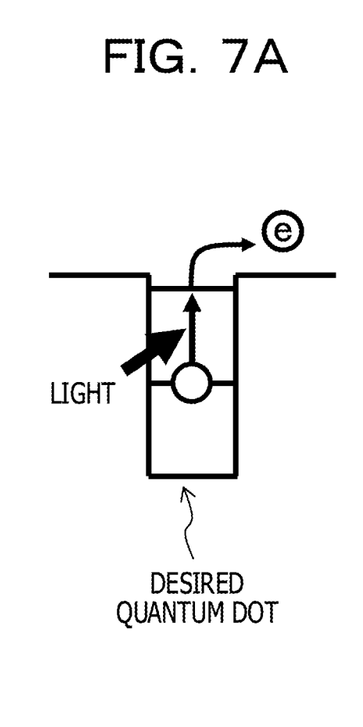
FIGS. 7A to 7C are energy band diagrams for explaining the issue to be addressed by the embodiment.
Figure 7B:
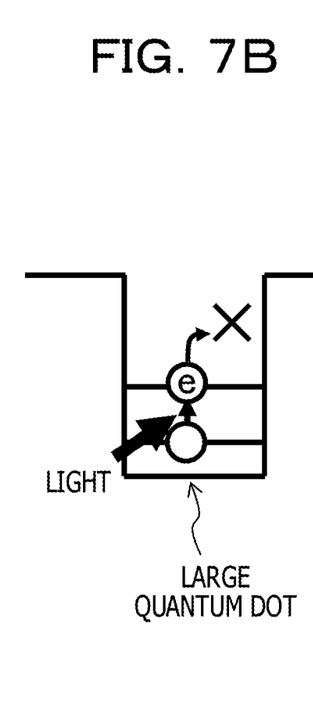
Figure 7C:
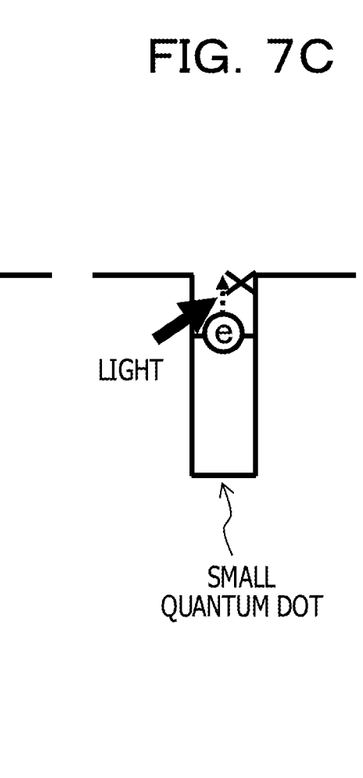

FIG. 7A illustrates quantum levels (a ground level and an excited level) observed when a quantum dot of the desired size is formed. FIG. 7B illustrates quantum levels (a ground level and an excited level) observed when a quantum dot of a size other than the desired size (specifically, a quantum dot of a size larger than the desired size) is formed. FIG. 7C illustrates a quantum level (ground level) observed when a quantum dot of a size other than the desired size (specifically, a quantum dot of a size smaller than the desired size) is formed.

Accordingly, despite the intention to form quantum dots of the desired size that have undergone quantum level control to obtain a desired detection wavelength, the size variation in the quantum dots causes formation of quantum dots having sizes other than the desired size and leading to quantum levels deviating from the condition.

In the quantum dots as described above, a small degree of deviation leads to deviation in a detection wavelength. A large degree of deviation leads to slight contribution to optical current. For example, an absorption probability decrease, a decrease in excited level escape probability, or a decrease in probability of transition to a continuum is caused.

Electrons bound to the quantum dots may escape from the bound state due to not only excitation caused by light absorption but also thermal excitation. The electrons as described above generate current (dark current) flowing regardless of light incidence. The dark current serves as a noise source of the detector.

Accordingly, the quantum dots leading to the quantum levels deviating from the desired condition do not contribute to the optical current but contribute to the dark current. The quantum dots as described above slightly contribute to the sensitivity in light absorption, trap electrons flowing as the optical current, and thus rather deteriorate the sensitivity.

For example, a quantum dot of a size larger than the desired size (particularly, a largely deviating and excessively large quantum dot; see FIG. 7B) does not contribute to the optical current due to a decrease in absorption probability, a decrease in excited level escape probability, or the like but contributes to the dark current due to the trapping of electrons flowing as the optical current, electron escape caused by the thermal excitation, or the like.

For example, a quantum dot of a size smaller than the desired size (particularly, a largely deviating and excessively small quantum dot; see FIG. 7C) does not contribute to the optical current due to a decrease in absorption probability, a decrease in probability of transition to the continuum, or the like but contributes to the dark current due to the trapping of electrons flowing as the optical current, electron escape caused by the thermal excitation, or the like.

As a result, the S/N of the quantum dot infrared detector is deteriorated. For example, the presence of a quantum dot that deviates from the condition and that is naturally formed at the time of forming quantum dots leads to the deterioration of the S/N of the quantum dot infrared detector.

Hence, in this embodiment, the quantum dot infrared detector is configured as described above.

FIG. 2 illustrates an energy band structure including a first quantum dot 14X having the desired size and the quantum levels leading to the desired detection wavelength.

With the configuration as described above, a voltage is applied such that the first resonant tunneling structure 15 is located on the cathode side (upstream in electron flow). In the first resonant tunneling structure 15, the resonance level (resonance energy) of the first resonant tunneling structure 15 is made to match the ground level of the first quantum dot 14X having the desired size and the quantum levels leading to the desired detection wavelength. Then, as illustrated in FIG. 2, the electrons flow through the first resonant tunneling structure 15 and, as a result of tunneling, are supplied to the ground level of the first quantum dot 14X.

The electrons having undergone photoexcitation in the first quantum dot 14X, as a result of tunneling, flow through the second resonant tunneling structure 16 on the other side of the first quantum dot 14X, that is, through the second resonant tunneling structure 16 in which the resonance level (resonance energy) of the second resonant tunneling structure 16 is made to match the excited level of the first quantum dot 14X. The electrons escape from the bound state and generate optical current.

As described above, by using the second resonant tunneling structure 16, optical current reduction and thus sensitivity deterioration are restrained.

In contrast, energy band structures each observed when a second quantum dot (quantum dot deviating from the condition) 14Y of a size other than the desired size is formed are illustrated in FIGS. 3 and 4.

FIG. 3 illustrates the energy band structure including the second quantum dot 14Y of a size larger than the desired size (excessively large quantum dot), and FIG. 4 illustrates the energy band structure including the second quantum dot 14Y of a size smaller than the desired size (excessively small quantum dot).

As illustrated in FIGS. 3 and 4, in each second quantum dot 14Y of a size other than the desired size, energy at the resonance level of the first resonant tunneling structure 15 and energy at the ground level (bound level) of the second quantum dot 14Y do not match, thus tunneling does not occur, and electrons are not supplied to the second quantum dot 14Y.

The electrons are not supplied at the ground level of the second quantum dot 14Y that does not resonate. Electrons flowing as the optical current are not trapped. Accordingly, this does not cause the sensitivity deterioration.

Energy at the resonance level of the second resonant tunneling structure 16 and energy at the excited level (bound level) of the second quantum dot 14Y do not match, thus tunneling does not occur, and the electrons present in the second quantum dot 14Y do not escape to the outside.

The electrons present at the excited level of the second quantum dot 14Y that does not resonate do not escape to the outside. The dark current (noise current) may thereby be restrained, and thus the noise of the detector may be reduced.

As described above, the electrons bound to the quantum dot 14Y deviating from the condition do not contribute to generation of the dark current and thus do not serve as the noise source. Accordingly, the deterioration of the S/N of the quantum dot infrared detector (photosensor) due to the quantum dot 14Y deviating from the condition may be restrained.

Further, since energy at the conduction band bottoms of the barrier layers 9 and 11 near the first quantum dots 14X and the second quantum dots 14Y is sufficiently high, electron escape in a process other than a tunneling process (tunneling), for example, electron escape in a thermal process may be restrained. Accordingly, the dark current (noise current) may be restrained, and thus the noise of the detector may be reduced.

Figure 8:
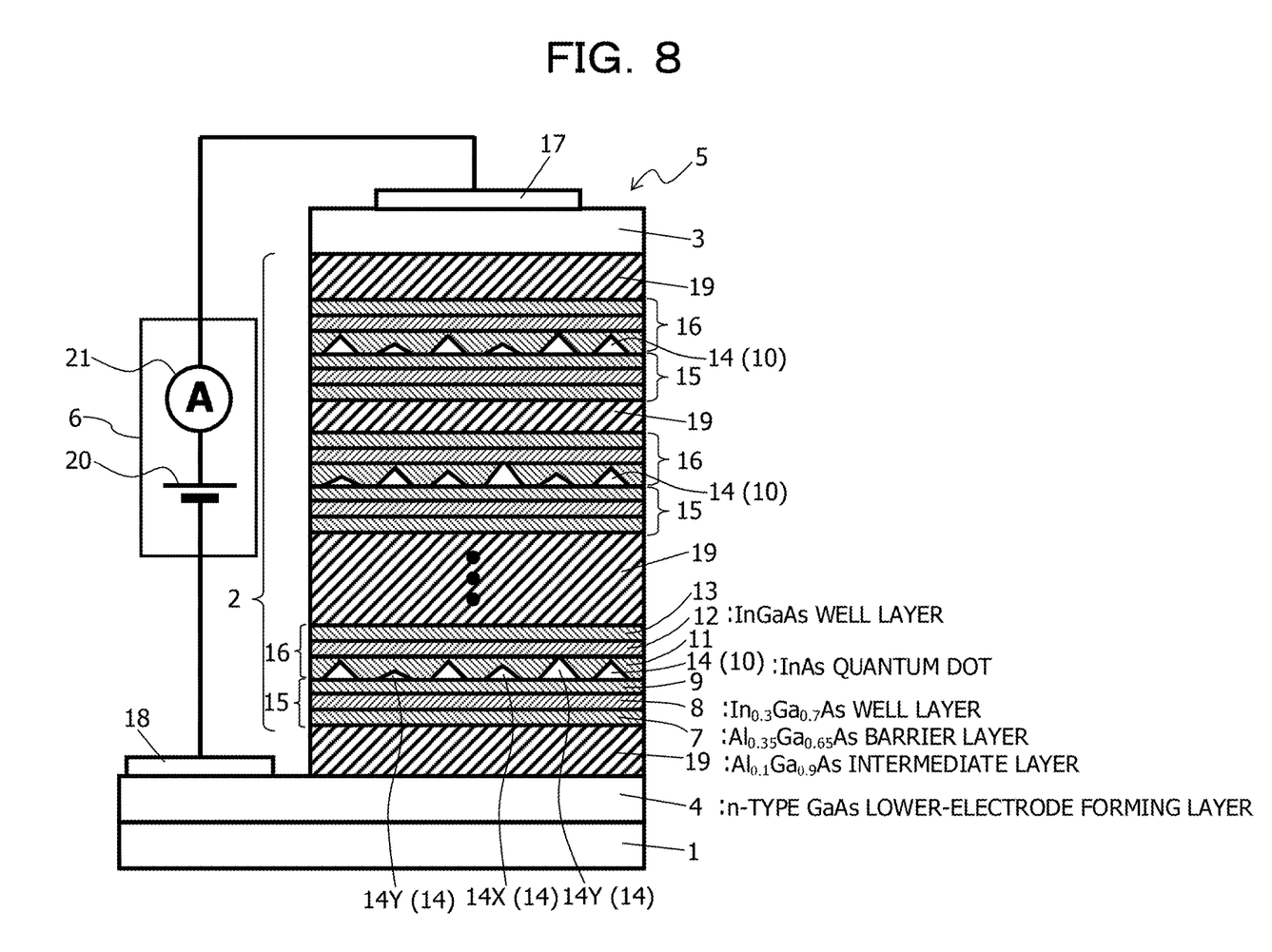
FIG. 8 is a schematic cross-sectional view illustrating a specific example configuration of the photodetector according to this embodiment.

For example, a quantum-dot active layer 2 included in the infrared detecting element 5 may have the following structure, for example, as illustrated in FIG. 8. The quantum-dot active layer 2 includes AlGaAs intermediate layers 19 on the uppermost and lowermost sides of the quantum-dot active layer 2. Each of InAs quantum dot groups 10 is disposed between a corresponding one of the first resonant tunneling structures 15 and a corresponding one of the second resonant tunneling structures 16. Sets of the InAs quantum dot group 10, the first resonant tunneling structure 15, and the second resonant tunneling structure 16 are stacked with AlGaAs intermediate layers 19 each interposed between the sets.

For example, the infrared detecting element 5 may have a structure in which an n-type GaAs lower-electrode forming layer 4, an AlGaAs intermediate layer 19, an AlGaAs barrier layer 7, an InGaAs well layer 8, an AlGaAs barrier layer 9, an InAs quantum dot group 10, an AlGaAs barrier layer 11, a GaAs well layer 12, an AlGaAs barrier layer 13, an AlGaAs intermediate layer 19, . . . , and an n-type GaAs upper-electrode forming layer 3 are stacked in order on a semi-insulating GaAs substrate 1.

Each InAs quantum dot group 10 includes InAs quantum dots (first quantum dots) 14X of the desired size and InAs quantum dots (second quantum dots) 14Y of sizes other than the desired size.

The quantum-dot active layer 2 includes the first resonant tunneling structure 15 including the AlGaAs barrier layer 7, the InGaAs well layer 8, and the AlGaAs barrier layer 9 on a first side of the InAs quantum dot group 10 (a lower side herein) and the second resonant tunneling structure 16 including the AlGaAs barrier layer 11, the GaAs well layer 12, and the AlGaAs barrier layer 13 on a second side (an upper side herein) of the InAs quantum dot group 10.

Figure 9:
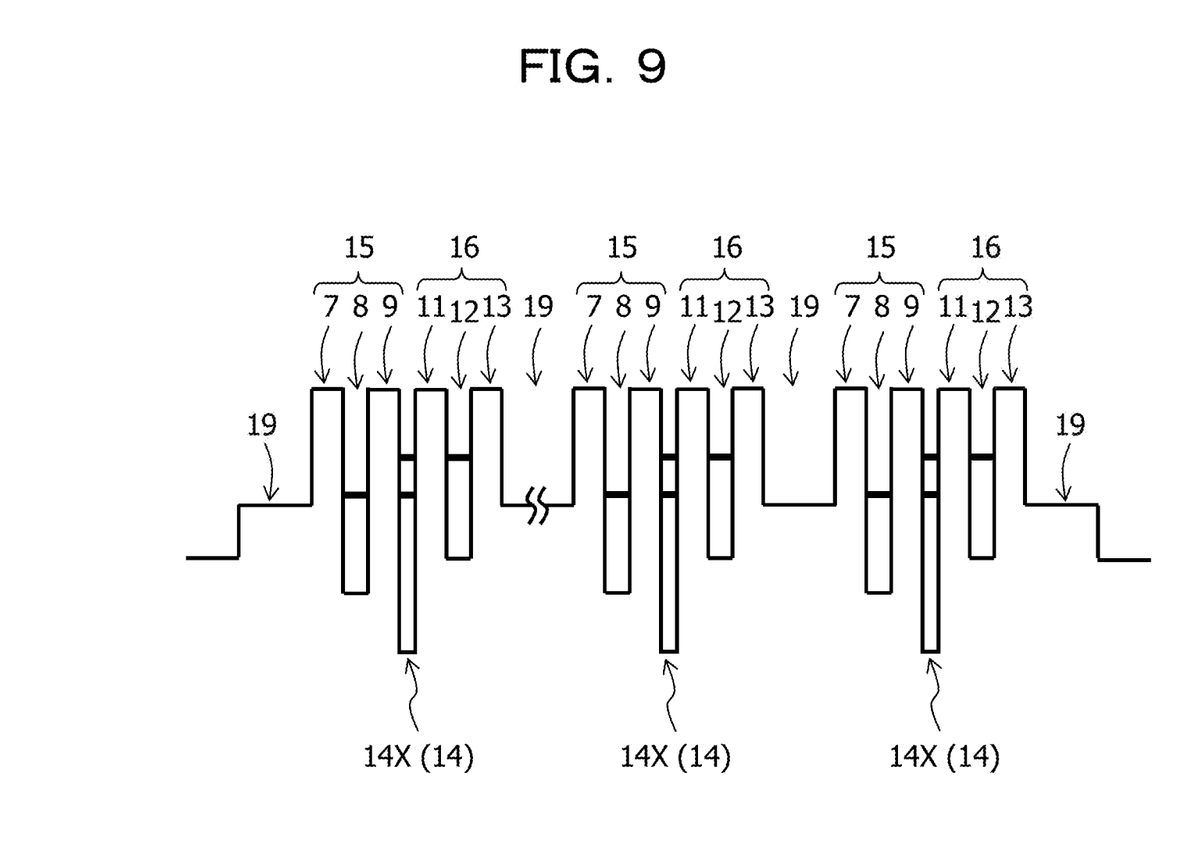
FIG. 9 is an energy band diagram of the specific example configuration of the photodetector according to this embodiment.

As illustrated in FIG. 9, the first resonance level of the first resonant tunneling structure 15 and the ground level of each first quantum dot 14X have a relationship that causes tunneling, and the second resonance level of the second resonant tunneling structure 16 and the excited level of the first quantum dot 14X have a relationship that causes tunneling.

The first resonance level of the first resonant tunneling structure 15 and the second resonance level of the second resonant tunneling structure 16 are herein different from each other. The first resonance level of the first resonant tunneling structure 15 and the ground level of the first quantum dot 14X match, and the second resonance level of the second resonant tunneling structure 16 and the excited level of the first quantum dot 14X match (see FIG. 2, for example).

If the size of a second quantum dot 14Y is larger than the desired size, the first resonance level of the first resonant tunneling structure 15 and the ground level of the second quantum dot 14Y have a relationship that does not cause tunneling, and the second resonance level of the second resonant tunneling structure 16 and the excited level of the second quantum dot 14Y have a relationship that does not cause tunneling (see FIG. 3, for example).

If the size of a second quantum dot 14Y is smaller than the desired size, the first resonance level of the first resonant tunneling structure 15 and the ground level of the second quantum dot 14Y have a relationship that does not cause tunneling, and the second resonance level of the second resonant tunneling structure 16 and the ground level of the second quantum dot 14Y have a relationship that does not cause tunneling (see FIG. 4, for example).

As described above, each quantum level of the second quantum dot 14Y of a size other than the desired size and a corresponding one of the first resonance level of the first resonant tunneling structure 15 and the second resonance level of the second resonant tunneling structure 16 have a corresponding one of the relationships that do not cause tunneling.

In the AlGaAs barrier layer 9 that is included in the first resonant tunneling structure 15 and that is in contact with the InAs quantum dot group 10 and in the AlGaAs barrier layer 11 that is included in the second resonant tunneling structure 16 and that is in contact with the InAs quantum dot group 10, energy at the conduction band bottom has a level enabling electron escape caused by thermal excitation to be restrained, the electron escape being, to the continuum, from the bound level of each of the InAs quantum dot (first quantum dot) 14X of the desired size and the InAs quantum dot (second quantum dot) 14Y of a size other than the desired size (see FIGS. 9 and 2 to 4, for example).

A plurality of infrared detecting elements 5 may be arranged in a two-dimensional array to form an infrared detecting element array. In this case, the infrared detecting elements 5 undergo device isolation and each serves as a pixel.

Each AlGaAs intermediate layer 19 is herein, for example, an $Al_{0.1}Ga_{0.9}As$ intermediate layer.

The AlGaAs barrier layers 7, 9, 11, and 13 are, for example, $Al_{0.35}Ga_{0.65}As$ barrier layers.

The InGaAs well layers 8 and 12 are, for example, $In_{0.3}Ga_{0.7}As$ well layers.

The upper electrode (metal electrode; an anode herein) 17 and the lower electrode (metal electrode; a cathode herein) 18 that are formed from, for example, AuGe/Au are respectively attached to the n-type GaAs lower-electrode forming layer 4 and the n-type GaAs upper-electrode forming layer 3.

Each of the upper electrode 17 and the lower electrode 18 is also referred to as a current extracting electrode. The upper electrode 17 and the lower electrode 18 are used for driving the corresponding infrared detecting element 5 and reading optical current generated in response to infrared rays entering the active layer 2 and thus are each also referred to as a driving electrode or a driving and reading electrode.

Further, the external circuit 6 having a function of driving the infrared detecting element 5 and a function of reading out optical current flowing through the infrared detecting element 5 is connected to the upper electrode 17 and the lower electrode 18.

The external circuit 6 includes a power source 20 and a current detector 21. The power source 20 applies a bias voltage between the upper electrode 17 and the lower electrode 18 and drives the infrared detecting element 5. The current detector 21 detects optical current flowing through the infrared detecting element 5. The power source 20 is herein a constant voltage source.

The current detector 21 may be any apparatus as long as the apparatus detects optical current and may also be an apparatus that detects optical current based on, for example, a voltage. The power source 20 is also referred to as a driving power source or a power supply circuit. The current detector 21 is also referred to as a current detection circuit.

The bias voltage supplied from the power source 20 is used to provide a potential difference between the upper electrode 17 and the lower electrode 18 to cause the lower electrode 18 and the upper electrode 17 to respectively serve as the cathode and the anode. The current detector 21 is configured to detect the optical current flowing across the upper electrode 17 and the lower electrode 18.

A current change in response to incident infrared rays, that is, a current change due to optical current generation caused by infrared rays entering the active layer 2 is thereby detected, and thereby the infrared rays may be detected.

If the plurality of infrared detecting elements 5 are arranged in a two-dimensional array to form the infrared detecting element array, a signal processing circuit array connected to the infrared detecting element array via bumps includes the external circuit 6.

The quantum dot infrared detector configured as described above may detect an optical signal in the following manner. In response to infrared rays entering the active layer 2 of each infrared detecting element 5, electrons bound to the quantum dots 14 absorb the infrared rays, are excited, escape from the bound state, are collected in one of the upper electrode 17 and the lower electrode 18 due to the potential difference therebetween, and generate optical current. By reading out a change in the current flowing through the infrared detecting element 5, an optical signal may be detected.

For example, in response to infrared rays incident into the infrared detecting element 5, photoelectric conversion is performed in the active layer 2, and optical current flows through the infrared detecting element 5. Accordingly, when the current detector 21 detects an amount of current flowing through the infrared detecting element 5, light may thereby be detected.

Subsequently, a method for manufacturing a photodetector according to this embodiment will be described.

The method for manufacturing a photodetector of this embodiment includes: forming the quantum dot group 10 including the first quantum dots 14X of the desired size and the second quantum dots 14Y of sizes other than the desired size; forming, on the first side of the quantum dot group 10, the first resonant tunneling structure 15 including the barrier layer 7, the well layer 8, and the barrier layer 9, the forming being performed to provide the first resonant tunneling structure 15 with the first resonance level leading to tunneling in the relationship with the ground level of each first quantum dot 14X; and forming, on the second side of the quantum dot group 10, the second resonant tunneling structure 16 including the barrier layer 11, the well layer 12, and the barrier layer 13, the forming being performed to provide the second resonant tunneling structure 16 with the second resonance level leading to tunneling in the relationship with the excited level of the first quantum dot 14X.

Hereinafter, a method for manufacturing a quantum dot infrared detector that is a type of the quantum dot photodetector will be described taken as an example.

First, an n-type GaAs lower-electrode forming layer is formed as the lower-electrode layer 4 on the semi-insulating GaAs substrate 1, for example, by the molecular beam epitaxy (MBE) method (see FIG. 8, for example).

The n-type GaAs lower-electrode forming layer 4 has a thickness of, for example, 1000 nm. For example, Si is used as an n-type dopant, and the concentration thereof is, for example, about $2 \times 10^{18}/\text{cm}^3$.

Subsequently, an AlGaAs intermediate layer is formed as the intermediate layer 19 on the n-type GaAs lower-electrode forming layer 4 (see FIG. 8, for example).

The AlGaAs intermediate layer 19 has a thickness of, for example, about 50 nm and has an Al composition of, for example, about 0.1. For example, the AlGaAs intermediate layer 19 is an $Al_{0.1}Ga_{0.9}As$ intermediate layer having a thickness of about 50 nm.

Subsequently, an AlGaAs barrier layer is formed as the barrier layer 7 on the AlGaAs intermediate layer 19 (see FIG. 8, for example).

The AlGaAs barrier layer 7 has a thickness of, for example, about 5 nm and has an Al composition of, for example, about 0.35. For example, the AlGaAs barrier layer 7 is an $Al_{0.35}Ga_{0.65}As$ barrier layer having a thickness of about 5 nm.

Subsequently, an InGaAs well layer is formed as the well layer 8 on the AlGaAs barrier layer 7 (see FIG. 8, for example).

The InGaAs well layer 8 has a thickness of, for example, about 3 nm and has an In composition of, for example, about 0.3. For example, the InGaAs well layer 8 is an $In_{0.3}Ga_{0.7}As$ well layer having a thickness of about 3 nm.

Subsequently, an AlGaAs barrier layer is formed as the barrier layer 9 on the InGaAs well layer 8 (see FIG. 8, for example).

The AlGaAs barrier layer 9 has a thickness of, for example, about 5 nm and has an Al composition of, for example, about 0.35. For example, the AlGaAs barrier layer 9 is an $Al_{0.35}Ga_{0.65}As$ barrier layer having a thickness of about 5 nm.

As described above, the first resonant tunneling structure 15 including the AlGaAs barrier layer 7, the InGaAs well layer 8, and the AlGaAs barrier layer 9 is formed under an InAs quantum dot group 10 formed as to be described later (see FIG. 8, for example).

Subsequently, an InAs quantum dot group including a plurality of InAs quantum dots 14 is formed as the quantum dot group 10 on the AlGaAs barrier layer 9 (see FIG. 8, for example).

Herein, about two molecular layers of InAs are grown at a substrate temperature of, for example, about 470° C., and thereby the InAs quantum dot group 10 including the plurality of InAs quantum dots 14 is formed through self-organization caused by crystal distortion.

The InAs quantum dot group 10 formed in this manner includes InAs quantum dots (first quantum dots) 14X of the desired size and InAs quantum dots (second quantum dots) 14Y of sizes other than the desired size (see FIG. 8, for example).

Subsequently, an AlGaAs barrier layer is formed as the barrier layer 11 in such a manner as to cover the InAs quantum dot group 10 (see FIG. 8, for example).

The AlGaAs barrier layer 11 has a thickness of, for example, about 5 nm and has an Al composition of, for example, about 0.35. For example, the AlGaAs barrier layer 11 is an $Al_{0.35}Ga_{0.65}As$ barrier layer having a thickness of about 5 nm.

Subsequently, an InGaAs well layer is formed as the well layer 12 on the AlGaAs barrier layer 11 (see FIG. 8, for example).

The InGaAs well layer 12 has a thickness of, for example, about 4 nm.

Subsequently, an AlGaAs barrier layer is formed as the barrier layer 13 on the InGaAs well layer 12 (see FIG. 8, for example).

The AlGaAs barrier layer 13 has a thickness of, for example, about 5 nm and has an Al composition of, for example, about 0.35. For example, the AlGaAs barrier layer 13 is an $Al_{0.35}Ga_{0.65}As$ barrier layer having a thickness of about 5 nm.

As described above, the second resonant tunneling structure 16 including the AlGaAs barrier layer 11, the InGaAs well layer 12, and the AlGaAs barrier layer 13 is formed on top of the InAs quantum dot group 10 (see FIG. 8, for example).

Subsequently, an AlGaAs intermediate layer is formed as the intermediate layer 19 on the AlGaAs barrier layer 13 (see FIG. 8, for example).

The AlGaAs intermediate layer 19 has a thickness of, for example, about 50 nm and has an Al composition of, for example, about 0.1. For example, the AlGaAs intermediate layer 19 is an $Al_{0.1}Ga_{0.9}As$ intermediate layer having a thickness of about 50 nm.

Subsequently, the same step is repeated a plurality of times (nine times herein). For example, the step in which the first resonant tunneling structure 15 including the AlGaAs barrier layer 7, the InGaAs well layer 8, and the AlGaAs barrier layer 9, the InAs quantum dot group 10, the second resonant tunneling structure 16 including the AlGaAs barrier layer 11, the InGaAs well layer 12, and the AlGaAs barrier layer 13, and the AlGaAs intermediate layer 19 are formed in order is repeated the plurality of times (nine times herein) (see FIG. 8, for example).

As described above, ten sets of the first resonant tunneling structure 15, the InAs quantum dot group 10, and the second resonant tunneling structure 16 are stacked above the n-type GaAs lower-electrode forming layer 4 with the AlGaAs intermediate layers 19 each interposed between the ten sets, and thereby the quantum-dot active layer 2 is formed (see FIG. 8, for example).

Subsequently, an n-type GaAs upper-electrode forming layer is formed as the upper-electrode layer 3 on the uppermost AlGaAs intermediate layer 19 (see FIG. 8, for example).

The n-type GaAs upper-electrode forming layer 3 has a thickness of, for example, 500 nm. For example, Si is used as an n-type dopant, and the concentration thereof is, for example, about $2\times10^{18}/cm^3$.

Thereafter, by using, for example, lithography, dry etching, or metal vapor deposition, digging to the n-type GaAs lower-electrode forming layer 4 is performed, and the upper electrode 17 and the lower electrode 18 (for example, AuGe/Au electrodes) are respectively formed on the n-type GaAs upper-electrode forming layer 3 and the n-type GaAs lower-electrode forming layer 4 (see FIG. 8, for example).

When the infrared detecting element array in which the plurality of infrared detecting elements 5 are arranged in a two-dimensional array is formed, element isolation trenches are formed to have the plurality of infrared detecting elements (pixels) 5.

To the upper electrode 17 and the lower electrode 18 disposed on each infrared detecting element 5 manufactured as described above, the external circuit 6, that is, the driving power source 20 and the current detector 21 are connected.

The quantum dot infrared detector (quantum dot photodetector) is thereby completed.

In this case, a potential difference is provided between the upper electrode 17 and the lower electrode 18 to cause the lower electrode 18 and the upper electrode 17 to respectively serve as the cathode and the anode. The current detector 21 detects current flowing therebetween, a current change in response to incident infrared rays may be observed, and thereby the quantum dot infrared detector is enabled to function as the infrared detector.

Materials and compositions used for the quantum dots 14 included in the quantum dot group 10, the barrier layers 7, 9, 11, and 13, the well layers 8 and 12 are not limited to the materials and compositions in the above-described embodiment.

For example, the quantum dots 14 included in the quantum dot group 10 (the first quantum dots 14X and the second quantum dots 14Y) may be formed from InAs or InGaAs. In the first resonant tunneling structure 15 and the second resonant tunneling structure 16, the barrier layers 7, 9, 11, and 13 may be formed from AlGaAs, and the well layers 8 and 12 may be formed from InGaAs, GaAs, or AlGaAs having lower Al content than Al content in AlGaAs from which the barrier layers 7, 9, 11, and 13 are formed.

In the above-described embodiment, the barrier layers 7, 9, 11, and 13 are formed from the same material and have the same composition and the same thickness; however, the material, composition, and the thickness are not limited thereto. As long as the levels of energy at the conduction band bottoms of the barrier layers 7, 9, 11, and 13 are higher than the levels of energy at the conduction band bottoms of the quantum dots 14 and the well layers 8 and 12, a different material, a different composition, or a different thickness may be used.

An imaging apparatus may be configured as an apparatus including the photodetector (specifically, the infrared detector) configured as described above.

Figure 10:
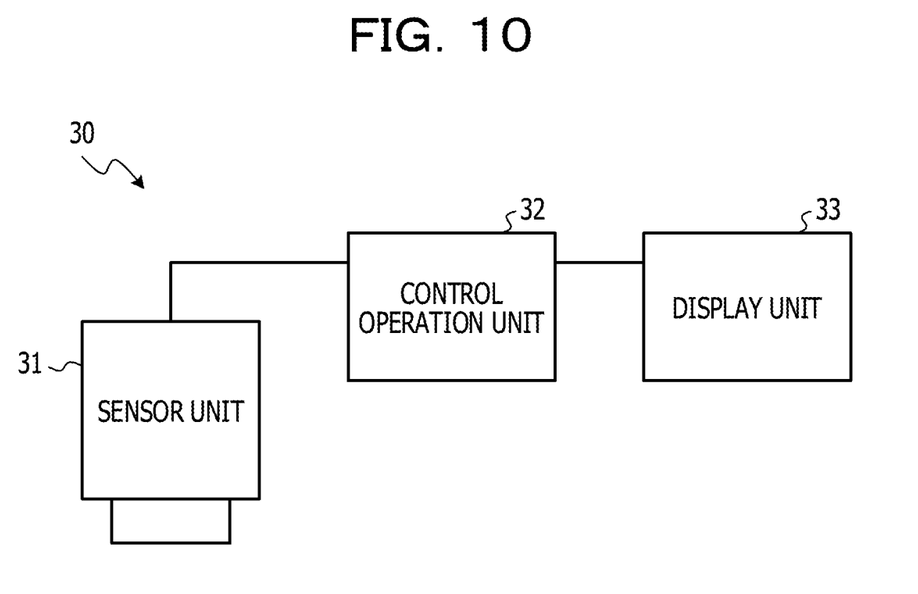
FIG. 10 is a schematic diagram illustrating an example configuration of an imaging apparatus according to this embodiment.

For example, as illustrated in FIG. 10, an imaging apparatus 30 may include a sensor unit 31 including the photodetector (specifically, the infrared detector) configured as described above, a control operation unit 32, and a display unit 33. An image based on infrared rays entering the sensor unit 31 may be displayed on the display unit 33.

In this case, the imaging apparatus 30 includes the sensor unit 31 including the photodetector (specifically, the infrared detector) configured as described above and the control operation unit 32 connected to the sensor unit 31.

Therefore, the photodetector according to this embodiment, the method for manufacturing the same, and the imaging apparatus exert an effect in which the S/N is improved in the photodetector using quantum dots.

The configuration of the embodiment is not limited to the configuration described in the embodiment above, and various modifications may be made without departing from the spirit of the embodiment.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A photodetector comprising:
   a quantum dot group including a first quantum dot of a reference size and a second quantum dot of a size other than the reference size;
   a first resonant tunneling structure disposed on a first side of the quantum dot group and including a barrier layer, a well layer, and a barrier layer; and
   a second resonant tunneling structure disposed on a second side of the quantum dot group and including a barrier layer, a well layer, and a barrier layer, wherein
   a first resonance level of the first resonant tunneling structure and a ground level of the first quantum dot have a relationship that causes tunneling, and a second resonance level of the second resonant tunneling structure and an excited level of the first quantum dot have a relationship that causes tunneling.

2. The photodetector according to claim 1, wherein the first resonance level of the first resonant tunneling structure and the second resonance level of the second resonant tunneling structure are different from each other.

3. The photodetector according to claim 1, wherein the first resonance level of the first resonant tunneling structure and the ground level of the first quantum dot match, and the second resonance level of the second resonant tunneling structure and the excited level of the first quantum dot match.

4. The photodetector according to claim 1, wherein the first quantum dot and the second quantum dot are formed from InAs or InGaAs, and
   in the first resonant tunneling structure and the second resonant tunneling structure, the barrier layers are formed from AlGaAs, and the well layer are formed from InGaAs, GaAs, or AlGaAs having lower Al content than Al content in AlGaAs from which the barrier layers are formed.

5. The photodetector according to claim 1, wherein in one of the barrier layers that is included in the first resonant tunneling structure and that is in contact with the quantum dot group and in one of the barrier layers that is included in the second resonant tunneling structure and that is in contact with the quantum dot group, energy at a conduction band bottom has a level enabling electron escape caused by thermal excitation to be restrained, the electron escape being from a bound level of each of the first quantum dot and the second quantum dot to a continuum.

6. The imaging apparatus according to claim 1, wherein the first resonance level of the first resonant tunneling structure and the second resonance level of the second resonant tunneling structure are different from each other.

7. An imaging apparatus comprising:
   a sensor unit including a photodetector; and
   a control operation unit connected to the sensor unit,
   the photodetector including
   a quantum dot group including a first quantum dot of a reference size and a second quantum dot of a size other than the reference size,
   a first resonant tunneling structure disposed on a first side of the quantum dot group and including a barrier layer, a well layer, and a barrier layer, and
   a second resonant tunneling structure disposed on a second side of the quantum dot group and including a barrier layer, a well layer, and a barrier layer, wherein
   a first resonance level of the first resonant tunneling structure and a ground level of the first quantum dot have a relationship that causes tunneling, and a second resonance level of the second resonant tunneling structure and an excited level of the first quantum dot have a relationship that causes tunneling.

8. A method for manufacturing a photodetector comprising:
   forming a quantum dot group including a first quantum dot of a reference size and a second quantum dot of a size other than the reference size;
   forming, on a first side of the quantum dot group, a first resonant tunneling structure including a barrier layer, a well layer, and a barrier layer, the forming being performed to provide the first resonant tunneling structure with a first resonance level leading to tunneling in a relationship with a ground level of the first quantum dot; and
   forming, on a second side of the quantum dot group, a second resonant tunneling structure including a barrier layer, a well layer, and a barrier layer, the forming being performed to provide the second resonant tunneling structure with a second resonance level leading to tunneling in a relationship with an excited level of the first quantum dot.

* * * * *